United States Patent
Kim

(10) Patent No.: US 11,894,360 B2
(45) Date of Patent: Feb. 6, 2024

(54) SEMICONDUCTOR MEMORY DEVICE HAVING A CHANNEL PLUG

(71) Applicant: SK hynix Inc., Icheon-si (KR)

(72) Inventor: Jang Won Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 120 days.

(21) Appl. No.: 17/406,987

(22) Filed: Aug. 19, 2021

(65) Prior Publication Data

US 2022/0336437 A1 Oct. 20, 2022

(30) Foreign Application Priority Data

Apr. 14, 2021 (KR) .................. 10-2021-0048364

(51) Int. Cl.
*H01L 27/02* (2006.01)
*H01L 29/10* (2006.01)
*H10B 43/27* (2023.01)

(52) U.S. Cl.
CPC ...... *H01L 27/0207* (2013.01); *H01L 29/1037* (2013.01); *H10B 43/27* (2023.02)

(58) Field of Classification Search
CPC ............ H01L 27/0207; H01L 29/1037; H01L 23/522; H01L 25/0657; H10B 43/10; H10B 41/10; H10B 43/40; H10B 43/50; H10B 20/40–65; H10B 53/20; H10B 41/20–27; H10B 43/20–27; H10B 51/20; H10B 63/84–845; G11C 5/02–05
See application file for complete search history.

(56) References Cited

U.S. PATENT DOCUMENTS

2020/0203366 A1* 6/2020 Kim ................. H10B 41/50

FOREIGN PATENT DOCUMENTS

| KR | 1020200038375 A | 4/2020 |
| KR | 1020200041265 A | 4/2020 |

* cited by examiner

*Primary Examiner* — Cuong B Nguyen
(74) *Attorney, Agent, or Firm* — William Park & Associates Ltd.

(57) ABSTRACT

A semiconductor device includes a slit pattern and a trench pattern disposed to extend substantially in parallel with each other in a first direction and channel plugs between the slit pattern and the trench pattern. The channel plugs include a first channel plug adjacent to the slit pattern. A top surface shape of the first channel plug is an elliptical shape. A long axis direction of the first channel plug and the first direction form an acute angle.

20 Claims, 13 Drawing Sheets

SEMICONDUCTOR MEMORY DEVICE HAVING A CHANNEL PLUG

CROSS-REFERENCE TO RELATED APPLICATIONS

The present application claims priority to Korean Patent Application No. 10-2021-0048364, filed on Apr. 14, 2021, which is herein incorporated by reference in its entirety.

BACKGROUND

1. Technical Field

Embodiments of the disclosure relate to semiconductor memory devices having a channel plug.

2. Related Art

A semiconductor memory device including channel plugs extending in a vertical direction and a plurality of cells stacked in the vertical direction has been proposed.

SUMMARY

According to an embodiment of the disclosure, a semiconductor device may include a slit pattern and a trench pattern disposed to extend substantially in parallel with each other in a first direction and channel plugs between the slit pattern and the trench pattern. The channel plugs may include a first channel plug adjacent to the slit pattern. A top surface shape of the first channel plug may be an elliptical shape. A long axis direction of the first channel plug and the first direction may form an acute angle.

According to an embodiment of the disclosure, a semiconductor device may include a slit pattern and a trench pattern extending substantially in parallel with each other in a first direction and channel plugs between the slit pattern and the trench pattern. The channel plugs may include a first channel plug adjacent to the slit pattern, the first channel plug having an elliptical top surface shape or an elliptical cross-sectional shape, a second channel plug between the first channel plug and the trench pattern, a third channel plug between the second channel plug and the trench pattern, and a fourth channel plug between the third channel plug and the trench pattern. A first distance between the slit pattern and the first channel plug may be greater than a second distance between the first channel plug and the second channel plug.

According to an embodiment of the disclosure, a semiconductor device may include slit patterns extending in parallel with each other in a first direction, and channel plugs between the slit patterns. The channel plugs may include first channel plugs adjacent to the slit patterns and second channel plugs between the first channel plugs, top surface shapes of the second channel plugs are a circle shape, and a long axis direction of the first channel plugs and the first direction form an acute angle greater than 1° and less than 90°.

DETAILED DESCRIPTION

Figure 1A:
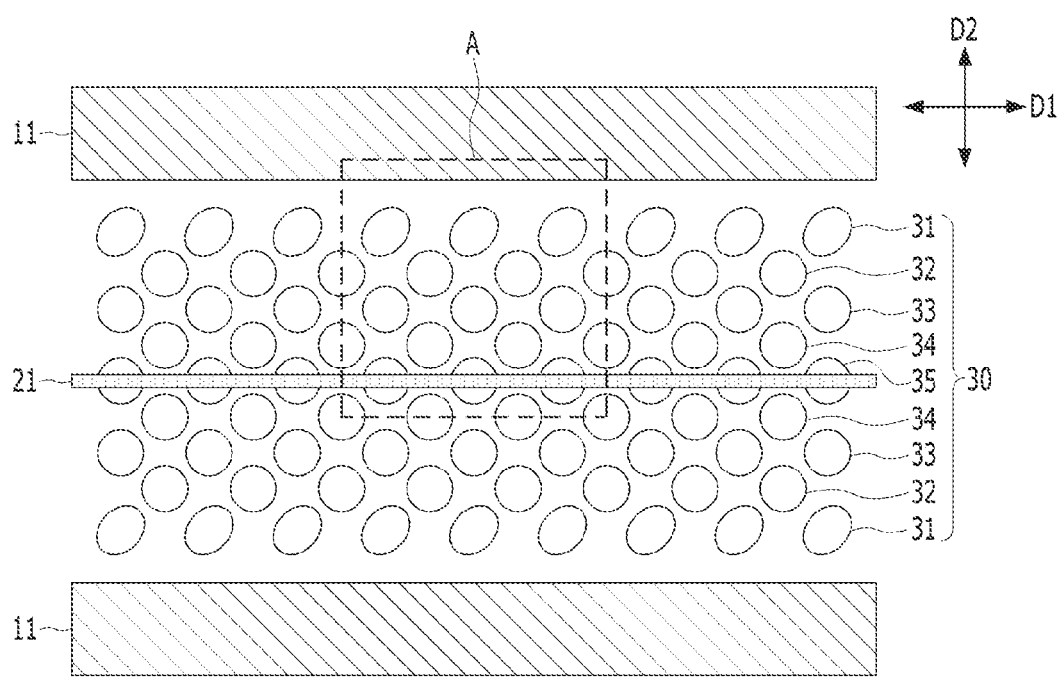
FIGS. 1A, 1B, 1C, 1D, 1E, and 1F are schematic layouts illustrating cell regions of semiconductor memory devices according to embodiments of the present disclosure.

Embodiments will be described below in more detail with reference to the accompanying drawings. The embodiments may, however, be embodied in different forms and should not be construed as limited to the embodiments set forth herein. Throughout the disclosure, like reference numerals refer to like parts throughout the various figures and embodiments.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer.

Embodiments of the disclosure provide a semiconductor memory device having a rotated elliptical shaped channel plug.

FIGS. 1A to 1F are schematic layouts illustrating cell regions of semiconductor memory devices according to embodiments of the present disclosure. Referring to FIGS. 1A to 1F, the semiconductor memory devices according to the embodiments of the disclosure may include slit patterns 11, a trench pattern 21, and channel plugs 30 disposed in a cell region, respectively.

The slit patterns 11 may extend in parallel with each other in a first direction D1. The slit patterns 11 may define an area in which the channel plugs 30 are to be disposed. For example, the channel plugs 30 may be disposed between the two parallel slit patterns 11. In one embodiment, the slit patterns 11 may include a conductor. For example, the slit patterns 11 may provide a conductive plug (11b in FIGS. 4A and 4B) to be connected to a common source layer (91 in FIGS. 4A and 4B).

The channel plugs 30 may be arranged in a zigzag matrix form or an oblique matrix form in the first direction D1 and a second direction D2 between the slit patterns 11. The first direction D1 and the second direction D2 may be perpendicular to each other.

The trench pattern 21 may be disposed between the slit patterns 11. The trench pattern 21 may extend parallel to the slit patterns 11 in the first direction D1. The trench pattern 21 may overlap some of the channel plugs 30. The trench pattern 21 may include an insulator.

Referring to FIG. 1A, the channel plugs 30 may include outermost channel plugs 31, outer channel plugs 32, inner channel plugs 33, innermost channel plugs 34, and dummy channel plugs 35 arranged in a zigzag form from the slit pattern 11 to the trench pattern 21. The outermost channel plugs 31 may be disposed in the first direction D1 to be adjacent to the slit patterns 11. The dummy channel plugs 35 may be disposed in the first direction to be traversed by the trench pattern 21. The innermost channel plug 34 may be disposed in the first direction D1 to be closer to the trench pattern 21 or the dummy channel plugs 35. The outer channel plugs 32 may be disposed in the first direction D1 to be closer to the outermost channel plugs 31. The inner channel plugs 33 may be disposed in the first direction D1 between the outer channel plugs 32 and the innermost channel plugs 34.

The trench pattern 21 may traverse the dummy channel plugs 35 in the first direction D1. A top surface shape of the dummy channel plugs 35 may be a separated circle shape separated by the trench pattern 21 in a top view. For example, the top surface shape of the dummy channel plugs 35 may be a semi-circle shape or a half-circle shape. A cross-sectional surface shape of the dummy channel plugs 35 may be a semi-circle shape, a half-circle shape, or a circular segment shape. Top surface shapes or cross-sectional surface shapes of the outer channel plugs 32, the inner channel plugs 33, and the innermost channel plugs 34 may be a circle shape. A top surface shape or a cross-sectional surface shape of the outermost channel plugs 31 may be an elliptical shape.

Figure 1B:
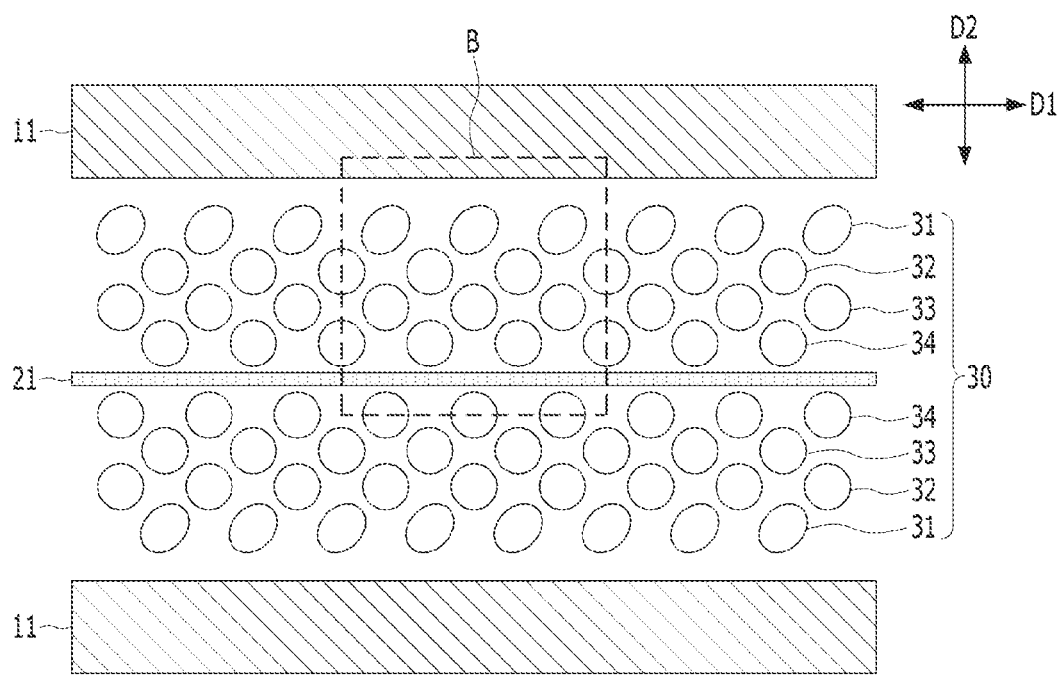

Referring to FIG. 1B, the channel plugs 30 may include outermost channel plugs 31, outer channel plugs 32, inner channel plugs 33, and the innermost channel plugs 34 arranged in a zigzag form from the slit pattern 11 to the trench pattern 21. The outermost channel plugs 31 may be disposed adjacent to the slit patterns 11. The outer channel plugs 32 may be disposed between the outermost channel plugs 31 and the trench pattern 21. The inner channel plugs 33 may be disposed between the outer channel plugs 32 and the trench pattern 21. The innermost channel plugs 34 may be disposed between the inner channel plugs 33 and the trench pattern 21. In comparison with FIG. 1A, the dummy channel plugs 35 may be omitted. For example, none of the channel plugs 30 may be traversed by the trench pattern 21.

Figure 1C:
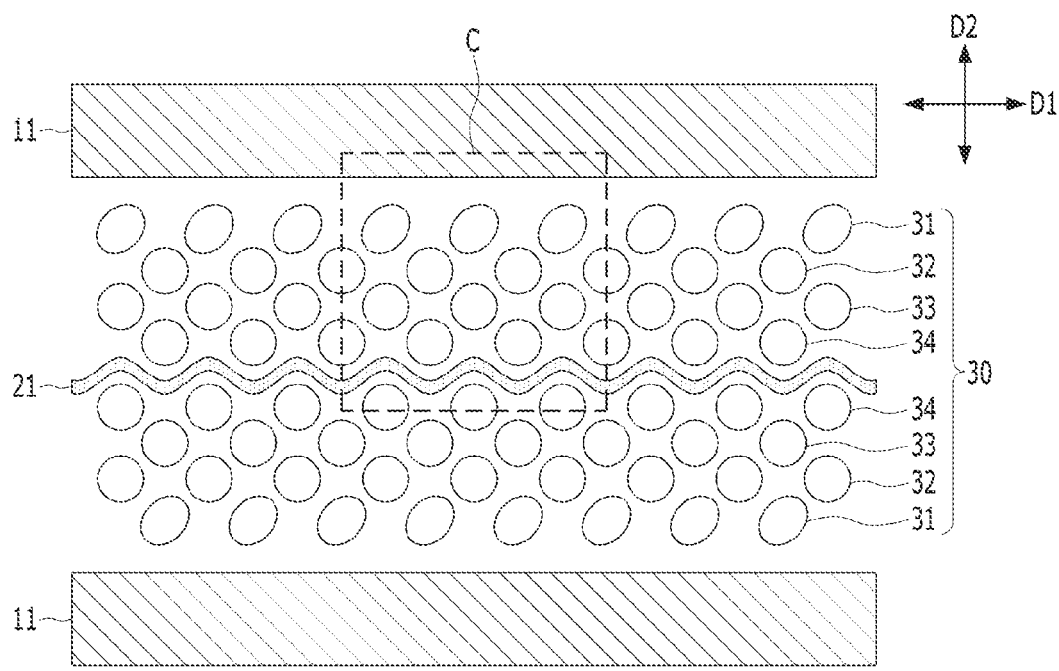

Referring to FIG. 1C, the channel plugs 30 may include outermost channel plugs 31 adjacent to the slit patterns 11, outer channel plugs 32 between the outermost channel plugs 31 and the trench pattern 21, inner channel plugs 33 between the outer channel plugs 32 and the trench pattern 21, and innermost channel plugs 34 between the inner channel plugs 33 and the trench pattern 21. The trench pattern 21 may extend in a zigzag form or a wave form in the first direction D1. In comparison with FIG. 1A, the dummy channel plugs 35 may be omitted. None of the channel plugs 30 may intersect the trench pattern 21.

Figure 1D:
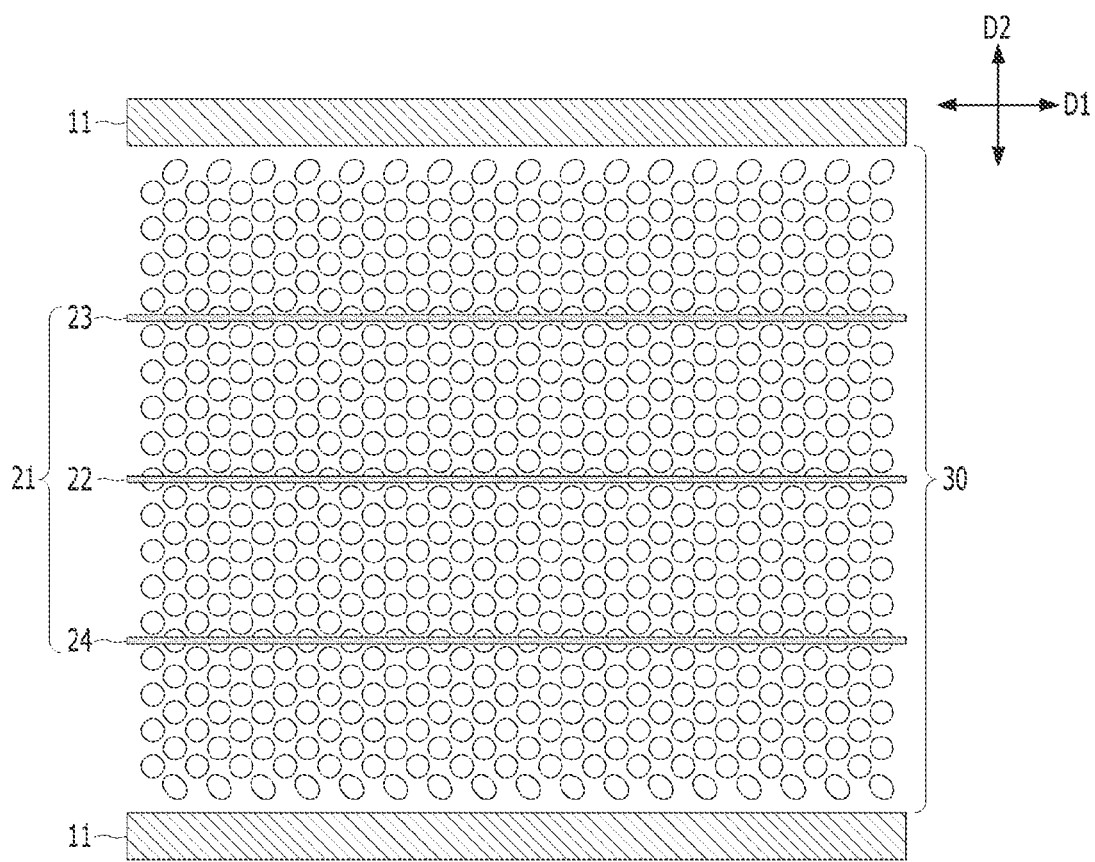
Figure 1E:
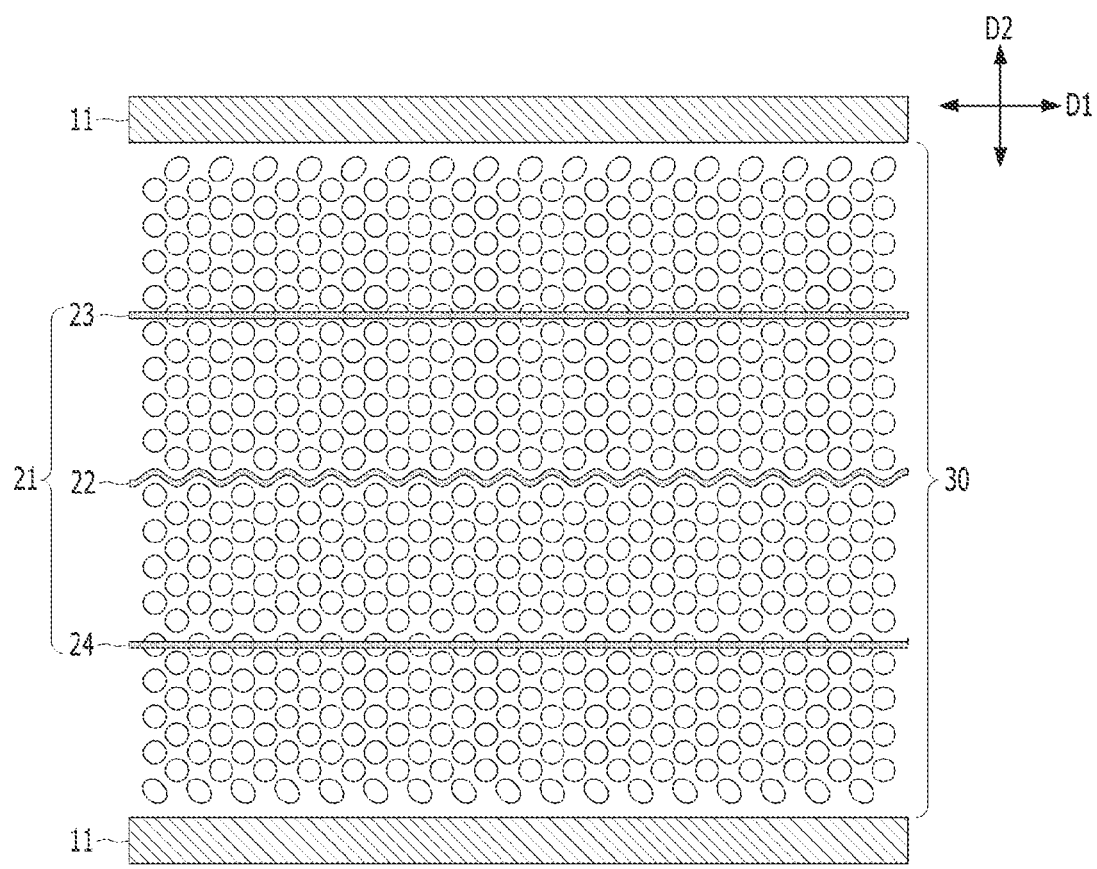
Figure 1F:
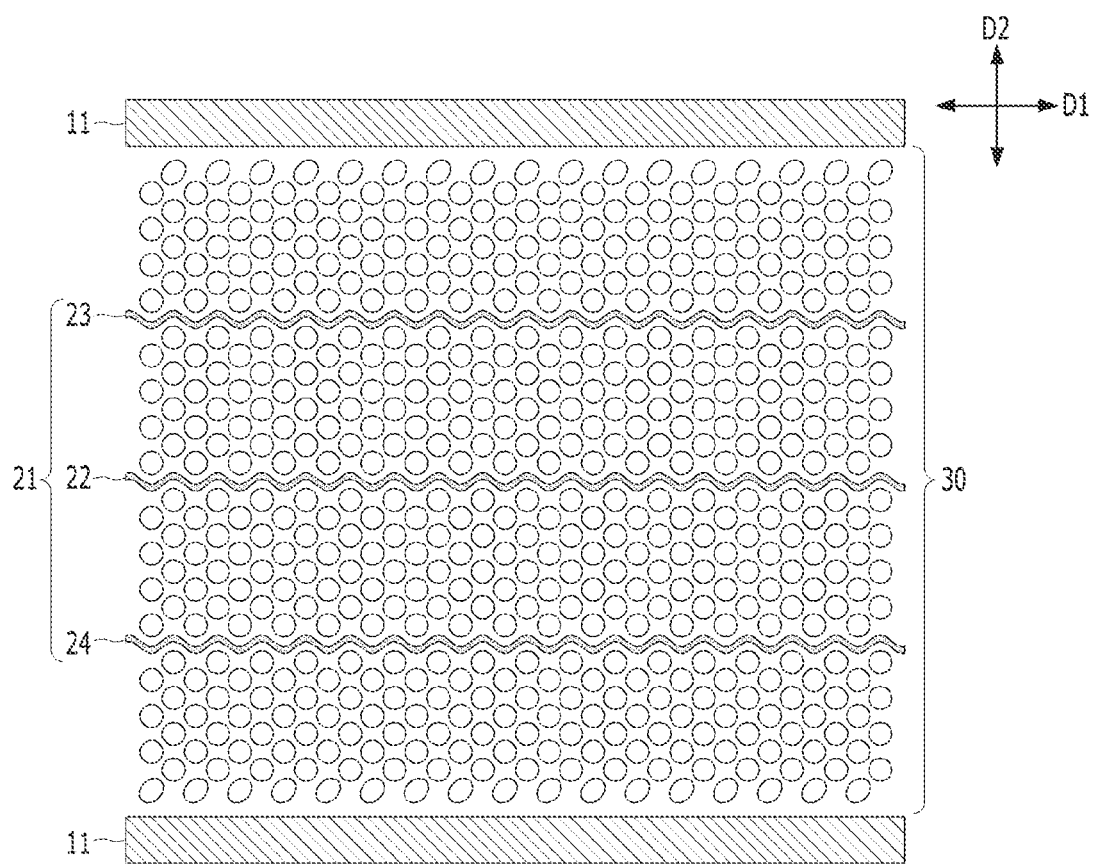

Referring to FIGS. 1D to 1F, a plurality of trench patterns 21 may be disposed between the two slit patterns 11. The number of channel plugs 30 in FIGS. 1D to 1F may be greater than the number of channel plugs 30 between two slit patterns 11 in FIGS. 1A to 1C. For example, two or more trench patterns 21 and channel plugs 30 may be disposed between two slit patterns 11 extending in parallel with each other in the first direction D1.

Referring to FIG. 1D, the trench patterns 21 may include a main trench pattern 22 disposed at the center between two slit patterns 11, and sub trench patterns 23 and 24 disposed between the slit patterns 11 and the main trench pattern 22. Further referring to FIG. 1A, trench patterns 21 may traverse dummy channel plugs 35.

Referring to FIG. 1E, the trench patterns 21 may include a wave shaped main trench pattern 22 and straight or rail shaped sub-trench patterns 23 and 24. Further referring to FIG. 1A, the sub trench patterns 23 and 24 may traverse the dummy channel plugs 35. Further referring to FIG. 1C, the main trench pattern 22 might not traverse any of the channel plugs 30. For example, the dummy channel plugs 35 traversed by the main trench pattern 22 may be omitted.

Referring to FIG. 1F, the trench patterns 21 may include a wave shaped main trench pattern 22 and wave shaped sub trench patterns 23 and 24. Referring to FIG. 1C, the main trench pattern 22 and the sub trench patterns 23 and 24 might not traverse any of the channel plugs 30. For example, the dummy channel plugs 35 may be omitted.

Figure 2A:
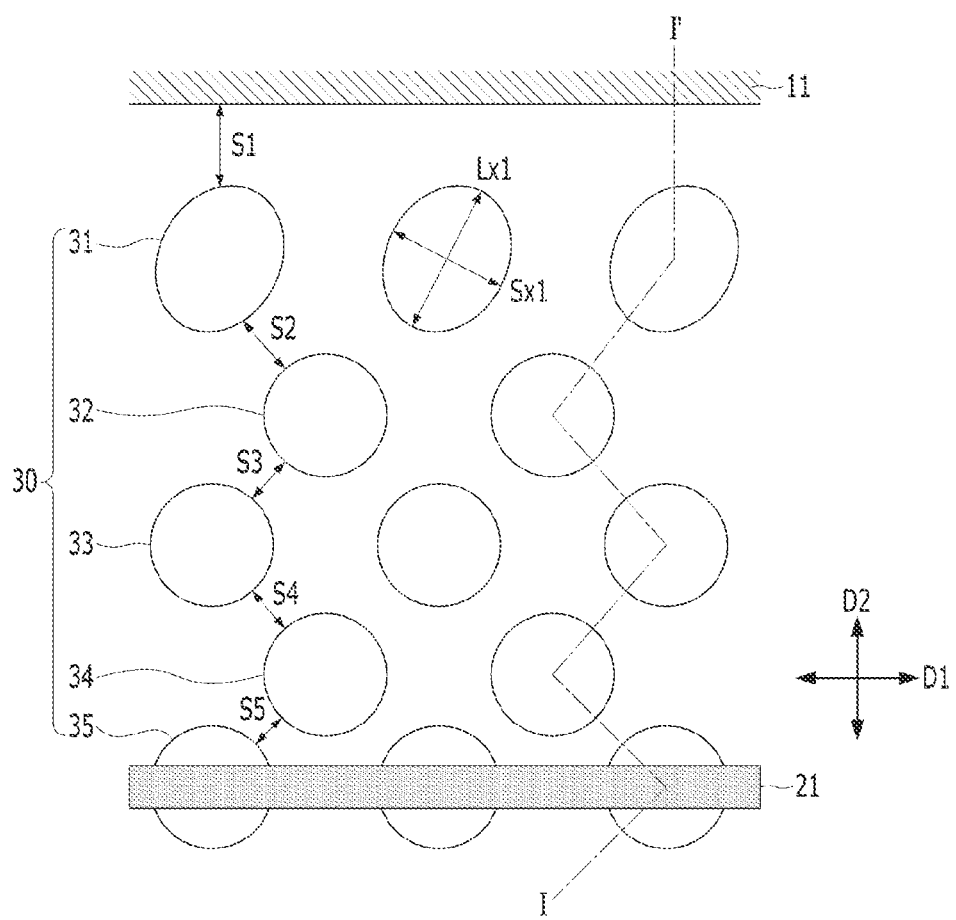
FIGS. 2A, 2B, and 2C are enlarged views of area 'A' of FIG. 1A.
Figure 2B:
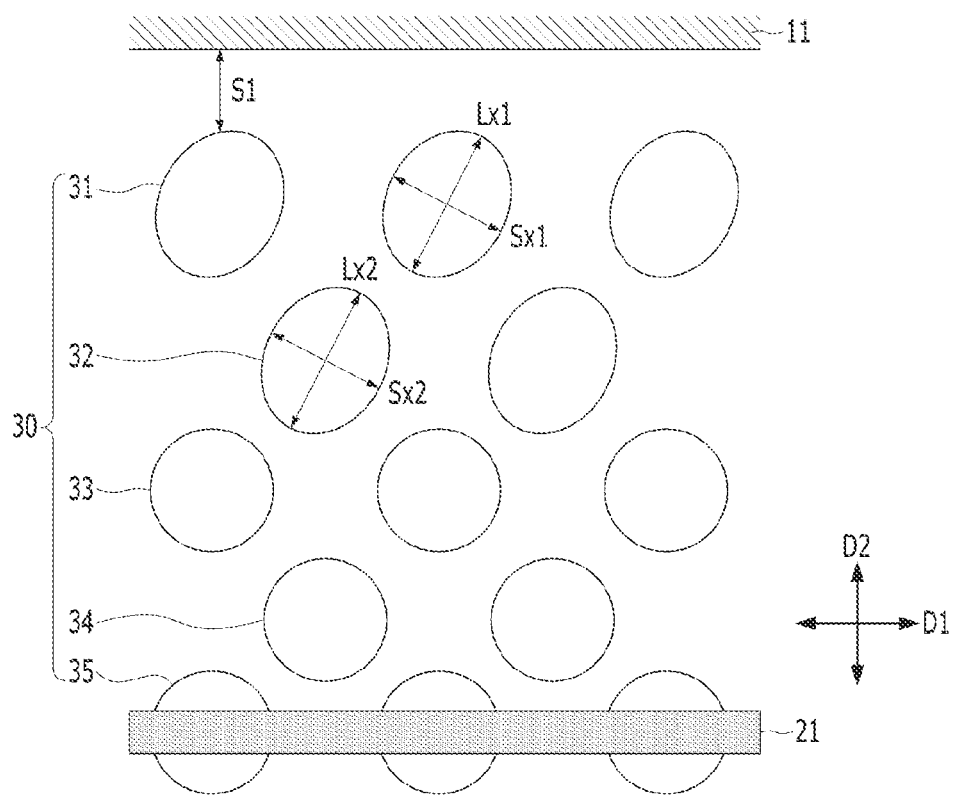
Figure 2C:
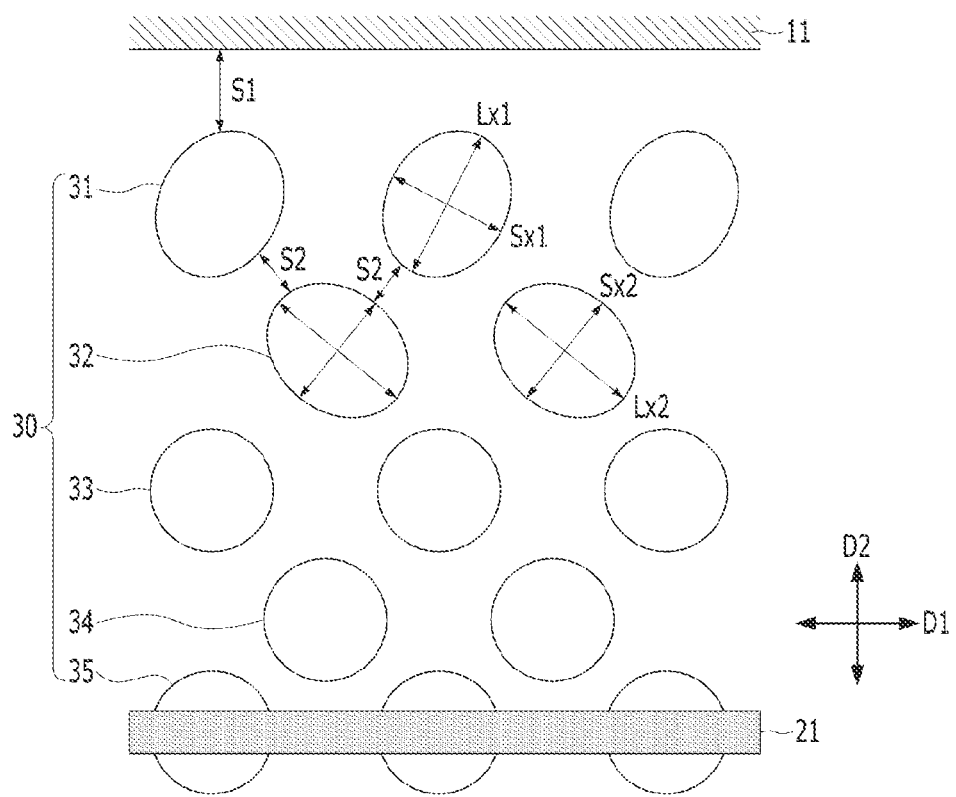

FIGS. 2A to 2C are enlarged views of area 'A' of FIG. 1A. Referring to FIG. 2A, a diameter of the outermost channel plug 31 in a long axis direction Lx1 may be greater than a diameter in a short axis Sx1 direction. For example, the diameter of the outermost channel plug 31 in the short axis direction Sx1 may be similar to or substantially the same as diameters of the outer channel plugs 32, the inner channel plugs 33, and the innermost channel plugs 34. The diameter of the outermost channel plugs 31 in the long axis direction Lx1 may be greater than the diameters of the outer channel plugs 32, the inner channel plugs 33, and the innermost channel plugs 34.

The outermost channel plug 31 may be disposed to be rotated. For example, the long axis direction Lx1 or the short axis direction Sx1 of the outermost channel plug 31 may form an acute angle between (+1°) to (+)90° or between (−1°) and (−90°) with respect to the first direction D1 or the second direction D2. In one embodiment, the long axis direction Lx1 or the short axis direction Sx1 of the outermost channel plug 31 may form an acute angle between (+1°) to (+)45° or an acute angle between (−1°) and (−45°) with respect to the first direction D1 or the second direction D2. By rotation of the outermost channel plugs 31, the shortest distance between the outermost channel plugs 31 and the slit pattern 11 may be increased. Since a first distance S1 between the outermost channel plugs 31 and the slit pattern 11 increases, a margin of a process for patterning the outermost channel plugs 31 and the slit pattern 11 can be improved. In addition, since portions surrounding the channel plugs 30 between the slit patterns 11—e.g., a word line stack 92 in FIGS. 4A and 4B—are areas in which word lines (94 in FIGS. 4A and 4B) and selection lines (95 in FIGS. 4A and 4B) are formed, widths of the word lines 94 and the selection lines 95 can be widened. Accordingly, resistance of the word lines 94 and the selection lines 95 can be lowered, operation of the semiconductor memory device can be accelerated, power consumption of the semiconductor memory device can be reduced, and performance of the semiconductor memory device can be improved.

In a direction from the trench pattern 21 toward the slit pattern 11, distances S5 to S1 between the channel plugs 30 may gradually increase. For example, the first distance S1 between the slit pattern 11 and the outermost channel plug 31 may be greater than a second distance S2 between the outermost channel plug 31 and the outer channel plug 32. The second distance S2 between the outermost channel plug 31 and the outer channel plug 32 may be greater than a third distance S3 between the outer channel plug 32 and the inner channel plug 33. The third distance S3 between the outer channel plug 32 and the inner channel plug 33 may be greater than a fourth distance S4 between the inner channel plug 33 and the innermost channel plug 34. The fourth distance S4 between the inner channel plug 33 and the innermost channel plug 34 may be greater than a fifth distance S5 between the innermost channel plug 34 and the dummy channel plug 35. (S1>S2>S3>S4>S5) The first to fifth distances S1 to S5 may be minimum distances or average distances between the two channel elements, respectively. Accordingly, degradation of uniformity due to a loading effect of an etching process for forming the channel plugs 30 can be alleviated. That is, process margins and etch consistency for forming the channel plugs 30 can be improved.

Referring to FIG. 2B, the top surfaces shape or a cross-sectional surface shape of the outermost channel plug 31 and the outer channel plug 32 may be an elliptical shape. The diameter of the outermost channel plugs 31 in the short axis directions Sx1 and the diameter of the outer channel plugs 32 in the short axis directions Sx2 may be similar to or substantially the same as diameters of the inner channel plug 33 and the innermost channel plug 34. The diameter of the outermost channel plug 31 in the long axis directions Lx1 and the diameter of the outer channel plug 32 in the long axis directions Lx2 may be greater than the diameters of the inner channel plug 33 and the innermost channel plug 34. The diameter of the outermost channel plug 31 in the short axis direction Sx1 may be substantially the same as the diameter of the outer channel plug 32 in the short axis direction Sx2. The diameter of the outermost channel plug 31 in the long axis direction Lx1 may be substantially the same as the diameter of the outer channel plug 32 in the long axis direction Lx2.

The outermost channel plug 31 and the outer channel plug 32 may be disposed to be rotated. For example, the long axis directions Lx1 and Lx2 or the short axis directions Sx1 and Sx2 of the outermost channel plug 31 and the outer channel plug 32 may form an acute angle between (+15°) to (+)45° or (−15°) to (−45°) with respect to the first direction D1 or the second direction D2, respectively. The outermost channel plug 31 and the outer channel plug 32 may be disposed to be rotated at the same angle. For example, the long axis direction Lx1 or the short axis direction Sx1 of the outermost channel plugs 31 may be substantially in parallel to the long axis direction Lx2 or the short axis direction Sx2 of the outer channel plug 32, respectively. In one embodiment, the long axis direction Lx1 or the short axis direction Sx1 of the outermost channel plug 31 may form acute angles with respect to the long axis direction Lx2 or the short axis direction Sx2 of the outer channel plug 32, respectively.

Referring to FIG. 2C, in comparison with FIG. 2B, the outermost channel plug 31 and the outer channel plug 32 may be disposed to be rotated at different angles. For example, the long axis direction Lx1 or the short axis direction Sx1 of the outermost channel plugs 31 may form an angle between (+1°) to (+45°) or (−1°) to (−45°) with respect to the long axis direction Lx2 or the short axis direction Sx2 of the outer channel plug 32, respectively. In comparison with FIG. 2B, the second distance S2 between the outermost channel plugs 31 and the outer channel plugs 32 can be increased depending on positions thereof.

Figure 3A:
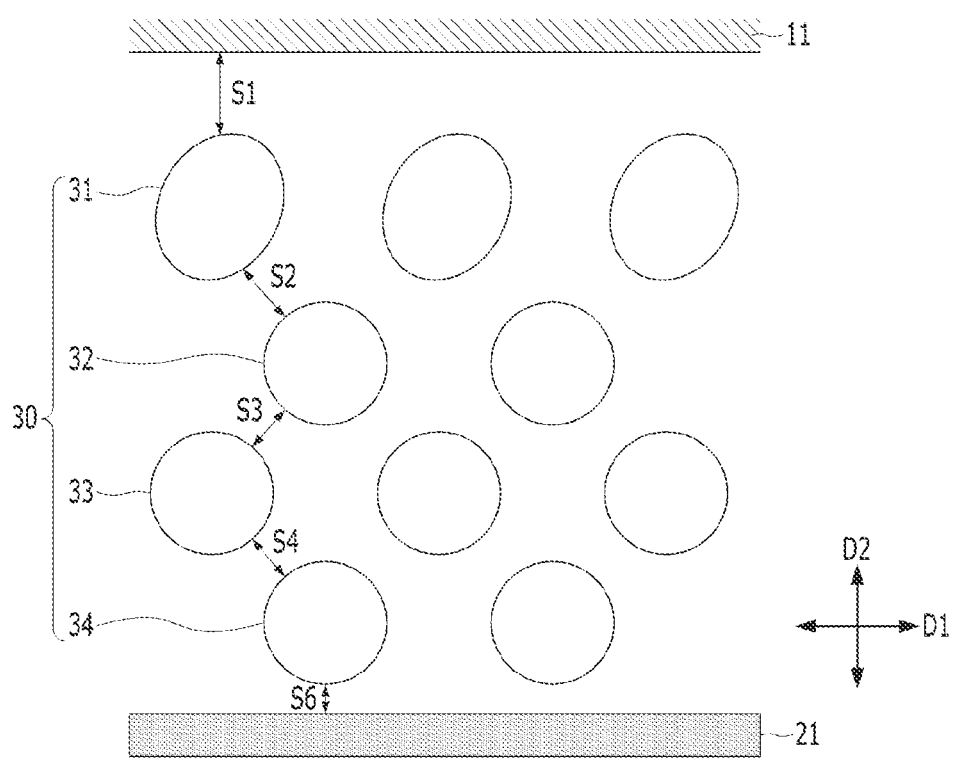
FIG. 3A is an enlarged view of area 'B' of FIG. 1B.

FIG. 3A is an enlarged view of area 'B' of FIG. 1B. Referring to FIG. 3A, in comparison with FIG. 2A, the dummy channel plugs 35 are omitted. For example, the trench pattern 21 might not traverse any of the channel plugs 30. A sixth distance S6 between the innermost channel plug 34 and the trench pattern 21 may be smaller than the first to fourth distances S1 to S4. The technical concepts described with reference to FIGS. 2B and 2C may be combined with the technical concept described with reference to FIG. 3A.

Figure 3B:
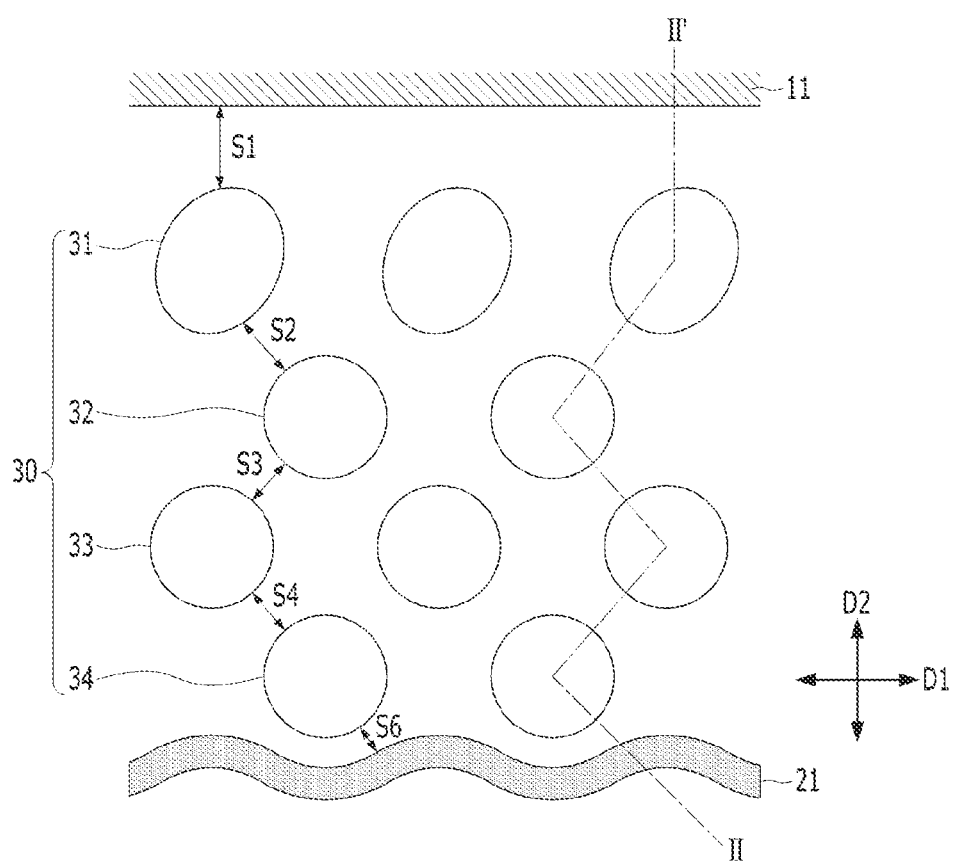
FIG. 3B is an enlarged view of area 'C' of FIG. 1C.

FIG. 3B is an enlarged view of area 'C' of FIG. 1C. Referring to FIG. 3C, the trench pattern 21 may extend in a wave form in the first direction D1. The trench pattern 21 might not traverse any of the channel plugs 30. The dummy channel plugs 35 may be omitted. The sixth distance S6 between the innermost channel plug 34 and the trench pattern 21 may be smaller than the first to fourth distances S1 to S4.

Figure 4A:
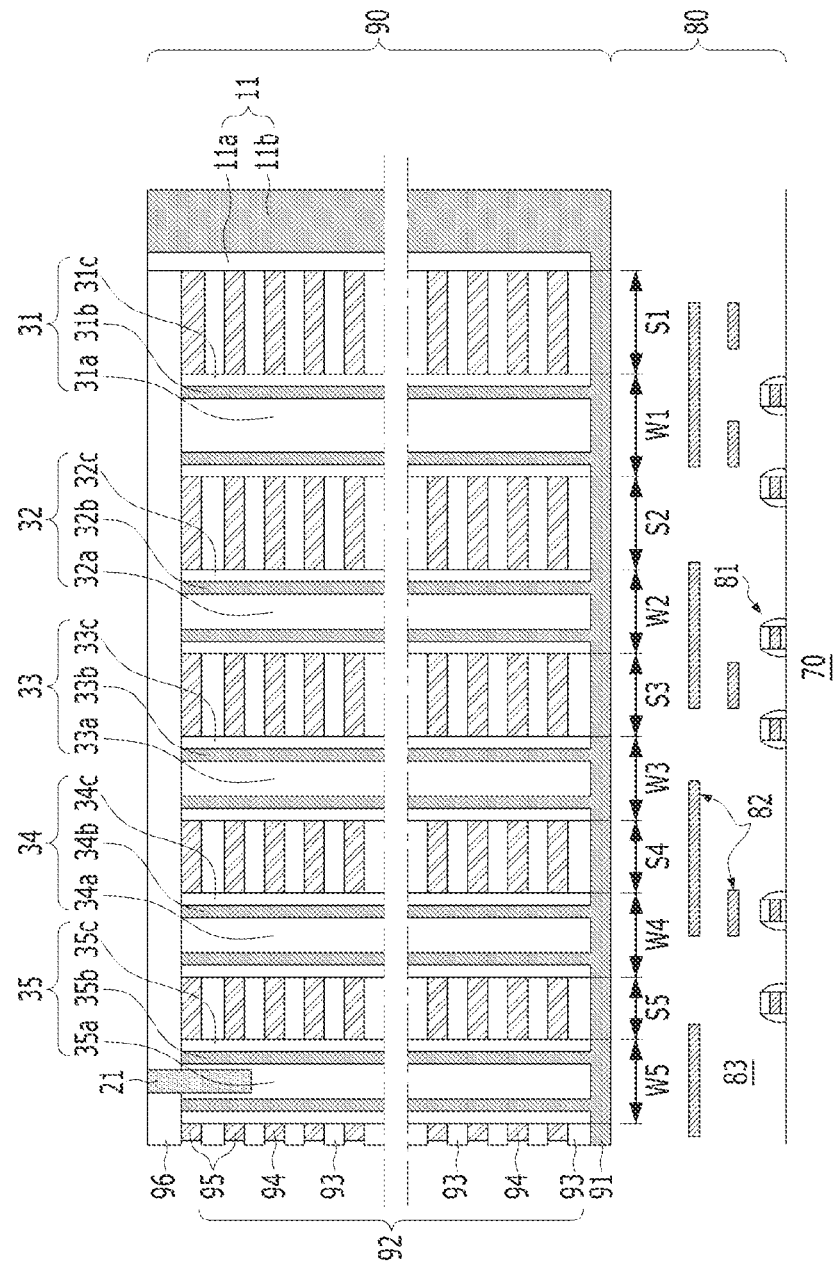
FIG. 4A is a schematic longitudinal cross-sectional view taken along line I-I' of FIG. 2A.

FIG. 4A is a schematic longitudinal cross-sectional view taken along line I-I' of FIG. 2A. Referring to FIG. 4A, a semiconductor memory device according to an embodiment of the disclosure may include a peripheral region 80 and a cell region 90 stacked on a substrate 70. The substrate 70 may include a semiconducting material layer such as a silicon wafer.

The peripheral region 80 may include peripheral circuits. For example, the peripheral region 80 may include peripheral transistors 81, peripheral interconnections 82, and a peripheral insulating layer 83. The peripheral transistors 81 may be directly disposed on the substrate 70 and may include NMOS transistors and PMOS transistors. The peripheral interconnections 82 may transmit electrical signals in a horizontal direction. The peripheral interconnections 82 may include a conductor such as metal. The peripheral insulating layer 83 may cover the peripheral transistors 81 and the peripheral interconnections 80. The peripheral insulating layer 83 may include an insulator such as silicon oxide. The cell region 90 may include a common source layer 91, a word line stack 92, channel plugs 31 to 35, a slit pattern 11, a trench pattern 21, and a capping insulating layer 96.

The common source layer 91 may be disposed on the peripheral insulating layer 83 in the peripheral region 80 as a plate shape or a rail shape. The common source layer 91 may include a conductor such as a silicon layer doped with N-type impurities, a metal silicide, a metal compound, or a metal.

The word line stack 92 may include interlayer insulating layers 93, and word lines 94 and selection lines 95 that are alternately stacked. The interlayer insulating layers 93 may include an insulator such as silicon oxide. The word lines 94 may include a conductor such as a metal or a metal compound. The selection lines 95 may be disposed on the word line stack 92 and may have the same configuration as the word lines 94. The channel plugs 31 to 35 may vertically penetrate the word line stack 92 to be connected to the common source layer 91.

The channel plugs 31 to 35 may include an outermost channel plug 31, an outer channel plug 32, an inner channel plug 33, an innermost channel plug 34, and a dummy channel plug 35. The channel plugs 31, 32, 33, 34, and 35 may include insulating pillars 31a, 32a, 33a, 34a, and 35a, channel layers 31b, 32b, 33b, 34b, and 35b, and memory layers 31c, 32c, 33c, 34c, and 35c, respectively. The insulating pillars 31a, 32a, 33a, 34a, and 35a may include an insulator such as silicon oxide. The channel layers 31b, 32b, 33b, 34b, and 35b may surround side surfaces of the insulating pillars 31a, 32a, 33a, 34a, and 35a. The channel layers 31b, 32b, 33b, 34b, and 35b may include a semiconducting material such as silicon. The channel layers 31b, 32b, 33b, 34b, and 35b may be electrically connected to the common source layer 91. The memory layers 31c, 32c, 33c, 34c, and 35c may surround the channel layers 31b, 32b, 33b, 34b, and 35b. The memory layers 31c, 32c, 33c, 34c, and 35c may include a tunneling insulating layer and a charge trap layer.

The slit pattern 11 may include a slit sidewall 11a and a slit plug 11b. The slit sidewall 11a may insulate the word lines 94 and selection lines 95 from the slit plug 11b. The slit sidewall 11a may include an insulator such as silicon oxide or silicon nitride. The slit plug 11b may include a conductor. The slit plug 11b may be electrically connected to the common source layer 91.

The trench pattern 21 may be recessed to separate upper portions of the dummy channel plug 35. The trench pattern 21 may electrically and structurally separate the selection lines 95. The trench pattern 21 may include an insulator such as silicon oxide.

The outermost channel plug 31 may have a first width W1, the outer channel plug 32 may have a second width W2, the inner channel plug 33 may have a third width W3, the innermost channel plug 34 may have a fourth width W4, and the dummy channel plug 35 may have a fifth width W5. The first width W1 may be greater than the second width W2, the third width W3, the fourth width W4, and the fifth width W5. The second width W2, the third width W3, the fourth width W4, and the fifth width W5 may be the same. (W1>W2=W3=W4=W5)

As described above, the first distance S1 between the slit pattern 11 and the outermost channel plug 31 may be greater than the second distance S2 between the outermost channel plug 31 and the outer channel plug 32. (S1>S2) The second distance S2 may be greater than the third distance S3 between the outer channel plug 32 and the inner channel plug 33. (S2>S3) The third distance S3 may be greater than the fourth distance S4 between the inner channel plug 33 and the innermost channel plug 34. (S3>S4) The fourth distance S4 may be greater than the fifth distance S5 between the innermost channel plug 34 and the dummy channel plug 35. (S4>S5)

In an embodiment, the second width W2 may be greater than the third width W3, the fourth width W4, and the fifth width W5. The third width W3, the fourth width W4, and the fifth width W5 may be the same. (W2>W3=W4=W5) The first width W1 may be larger than the second width W2. (W1>W2)

Figure 4B:
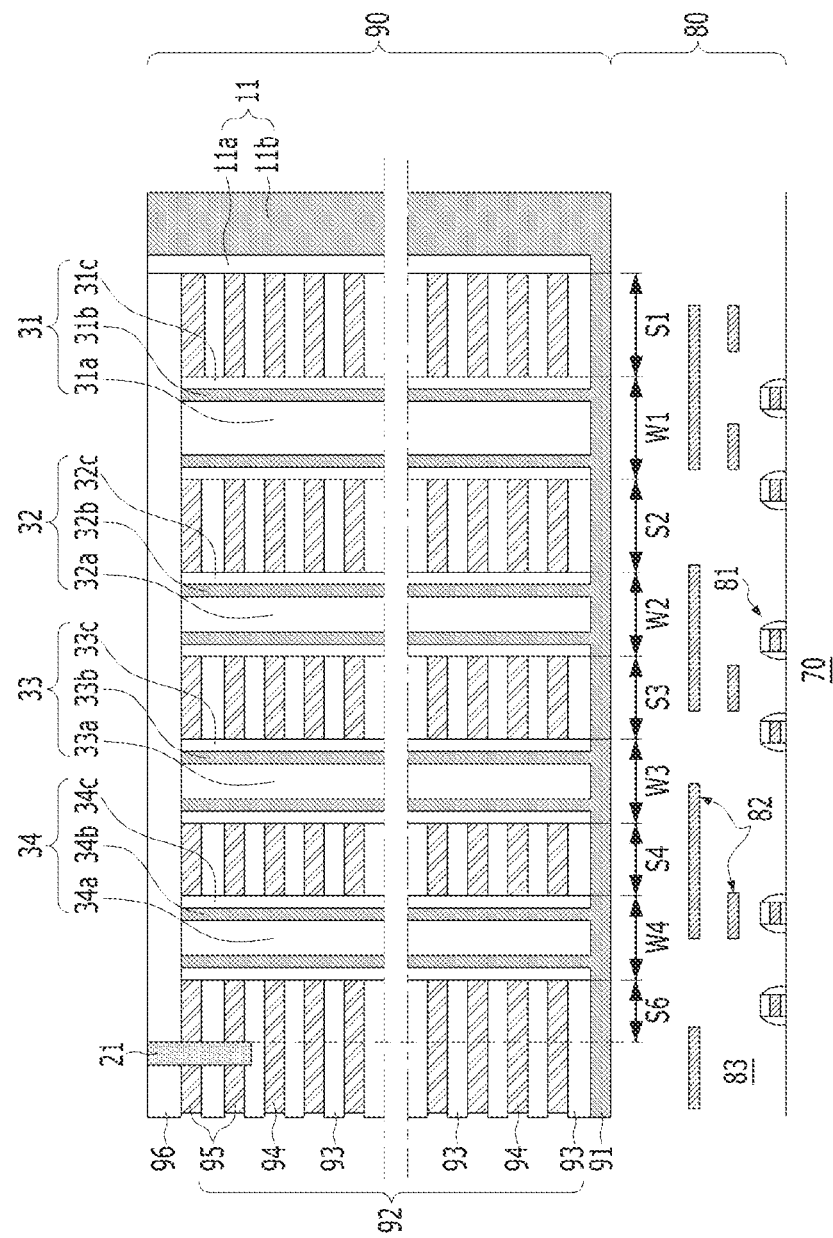
FIG. 4B is a schematic longitudinal cross-sectional view taken along the line II-II' in FIG. 3B.

FIG. 4B is a schematic longitudinal cross-sectional view taken along the line II-II' in FIG. 3B. Referring to FIG. 4B, a semiconductor memory device according to an embodiment of the disclosure may include a lower device layer 80 and an upper device layer 90 stacked on a substrate 70. The lower device layer 80 may include peripheral transistors 81, peripheral interconnections 82, and a peripheral insulating layer 83. The upper device layer 90 may include a common source layer 91, a word line stack 92, channel plugs 31, 32, 33, and 34, a slit pattern 11, a trench pattern 21, and a capping insulating layer 96. In comparison with FIG. 4A, the dummy channel plugs 35 may be omitted. For example, the trench pattern 21 might not traverse and overlap any of the channel plugs 31, 32, 33, and 34. The sixth distance S6 between the innermost channel plug 34 and the trench pattern 21 may be smaller than the other distances S1, S2, S3, and S4. Other elements not described may be understood with reference to FIG. 4A.

According to the embodiments of the disclosure, since a distance between the outermost channel plug and the slit pattern is widened, a process margin can be improved. Also, since widths of the word lines and the selection lines can be widened, resistances of the word lines and the selection lines can be lowered. Accordingly, performance of the semiconductor memory devices can be improved.

Although the disclosure has been specifically described according to the above-described preferred embodiments, it should be noted that the above-described embodiments are for the purpose of explanation and not for the limitation thereof.

What is claimed is:

1. A semiconductor device comprising:
   a slit pattern and a trench pattern disposed to extend substantially in parallel with each other in a first direction; and
   channel plugs between the slit pattern and the trench pattern,
   wherein:
   the channel plugs comprise:
   a first channel plug adjacent to the slit pattern,
   a second channel plug between the first channel plug and the trench pattern;
   a third channel plug between the second channel plug and the trench pattern;
   a fourth channel plug between the third channel plug and the trench pattern; and
   a fifth channel plug traversed by the trench pattern,
   wherein:
   a top surface shape of the first channel plug is an elliptical shape,
   a top surface shape of each of the third channel plug and the fourth channel plug is substantially a circle shape,
   a top surface shape of the fifth channel plug is substantially a separated circle shape separated by the trench pattern, and
   a long axis direction of the first channel plug and the first direction form an acute angle.

2. The semiconductor device of claim 1, wherein the trench pattern extends in a wave form in the first direction.

3. The semiconductor device of claim 1, wherein a first distance between the slit pattern and the first channel plug is greater than a second distance between the first channel plug and the second channel plug.

4. The semiconductor device of claim 3, wherein the second distance is greater than a third distance between the second channel plug and the third channel plug.

5. The semiconductor device of claim 4, wherein the third distance is greater than a fourth distance between the third channel plug and the fourth channel plug.

6. The semiconductor device of claim 5, wherein the fourth distance is greater than a fifth distance between the fourth channel plug and the trench pattern.

7. The semiconductor device of claim 1, wherein a top surface shape or a cross-sectional shape of the second channel plug is substantially a circle shape.

8. The semiconductor device of claim 7, wherein:
   a diameter of the first channel plug in the long axis direction is greater than a diameter of the second channel plug, and
   a diameter of the first channel plug in a short axis direction is substantially same as the diameter of the second channel plug.

9. The semiconductor device of claim 7, wherein diameters of the second channel plug, the third channel plug, and the fourth channel plug are substantially the same as each other.

10. The semiconductor device of claim 1, wherein a top surface shape of the second channel plug is substantially an elliptical shape.

11. The semiconductor device of claim 10, wherein the long axis direction of the first channel plug and a long axis direction of the second channel plug are substantially in parallel with each other.

12. The semiconductor device of claim 10, wherein the long axis direction of the first channel plug and a long axis direction of the second channel plug form an acute angle between 1° and 45°.

13. A semiconductor device comprising:
a slit pattern and a trench pattern extending substantially in parallel with each other in a first direction; and
channel plugs between the slit pattern and the trench pattern,
wherein the channel plugs comprise:
a first channel plug adjacent to the slit pattern, the first channel plug having an elliptical top surface shape or an elliptical cross-sectional shape;
a second channel plug between the first channel plug and the trench pattern;
a third channel plug between the second channel plug and the trench pattern; and
a fourth channel plug between the third channel plug and the trench pattern,
wherein a first distance between the slit pattern and the first channel plug is greater than a second distance between the first channel plug and the second channel plug.

14. The semiconductor device of claim 13, wherein a long axis direction of the first channel plug and the first direction form an acute angle between 1° and 45°.

15. The semiconductor device of claim 13, wherein:
the second distance is greater than a third distance between the second channel plug and the third channel plug, and
the third distance is greater than a fourth distance between the third channel plug and the fourth channel plug.

16. The semiconductor device of claim 13, further comprising:
a fifth channel plug being traversed by the trench pattern.

17. The semiconductor device of claim 13, wherein the trench pattern extends in a wave form in the first direction.

18. A semiconductor device comprising:
two slit patterns extending substantially in parallel with each other in a first direction;
a trench pattern between the two slit patterns extending in parallel with the slit patterns in the first direction; and
channel plugs between the slit patterns and the trench pattern,
wherein the slit patterns, the trench pattern, and the channel plugs are disposed in a cell region,
wherein the channel plugs comprise:
two first channel plugs adjacent to the slit patterns, respectively;
two second channel plugs between the two first channel plugs;
two third channel plugs between the two second channel plugs; and
two fourth channel plugs between the two third channel plugs, wherein:
the two first, second, third, and fourth channel plugs are arranged in a zigzag form in a second direction perpendicular to the first direction,
the trench pattern is disposed between the two fourth channel plugs,
top surface shapes of the two first channel plugs are an elliptical shape,
a maximum diameter of each of the two first channel plugs are greater than a maximum diameter of each of the two second, third, and the fourth channel plugs,
a long axis direction of the first two channel plugs and the first direction form an acute angle greater than 1° and less than 90°.

19. The semiconductor device of claim 18,
wherein:
each of the two first channel plugs is partially overlapped with the each of the two second channel plugs in the first direction,
each of the two second channel plugs is partially overlapped with the each of the two third channel plugs in the first direction, and
each of the two third channel plugs is partially overlapped with the each of the two fourth channel plugs in the first direction.

20. The semiconductor device of claim 18,
wherein:
each of the two first channel plugs is partially overlapped with the each of the two second channel plugs in the second direction,
each of the two second channel plugs is partially overlapped with the each of the two third channel plugs in the second direction, and
each of the two third channel plugs is partially overlapped with the each of the two fourth channel plugs in the second direction.

* * * * *